United States Patent
Yoon et al.

(10) Patent No.: US 6,376,355 B1
(45) Date of Patent: Apr. 23, 2002

(54) METHOD FOR FORMING METAL INTERCONNECTION IN SEMICONDUCTOR DEVICE

(75) Inventors: Mee-young Yoon; Sang-in Lee, both of Kyungki-do (KR)

(73) Assignee: Samsung Electronics Co., Ltd., Suwon-city (KR)

(*) Notice: Subject to any disclaimer, the term of this patent is extended or adjusted under 35 U.S.C. 154(b) by 0 days.

(21) Appl. No.: 09/136,798

(22) Filed: Aug. 19, 1998

(30) Foreign Application Priority Data

Aug. 22, 1997 (KR) .............................. 97-40236

(51) Int. Cl.⁷ ...................... H01L 21/4763; H01L 21/44
(52) U.S. Cl. ...................... 438/618; 438/642; 438/643; 438/652; 438/653
(58) Field of Search .............................. 438/618, 642, 438/643, 652, 653

(56) References Cited

U.S. PATENT DOCUMENTS

| | | | |
|---|---|---|---|
| 4,687,552 A | 8/1987 | Early et al. | 15/204 |
| 5,055,423 A | 10/1991 | Smith et al. | 187/437 |
| 5,151,168 A | 9/1992 | Gilton et al. | 123/205 |
| 568,177 A | * 2/1994 | Pasch et al. | 437/198 |
| 6,001,420 A | * 9/1996 | Mosely | 427/258 |
| 5,572,072 A | 11/1996 | Lee | 751/257 |
| 6,080,665 A | * 4/1997 | Chen et al. | 438/653 |
| 5,633,199 A | * 5/1997 | Fiordalice | 438/642 |
| 5,486,877 A | * 12/1998 | Kim | 438/625 |
| 5,846,877 A | * 12/1998 | Kim | 438/625 |

FOREIGN PATENT DOCUMENTS

| | | |
|---|---|---|
| DE | 19713501 | 11/1997 |
| EP | 97307355 | 3/1998 |
| KR | 93-30871 | 7/1995 |

OTHER PUBLICATIONS

Wolf, S., "Silicon Processing for the VLSI Era," v.2, 1990, p. 128, 167, 264.*

* cited by examiner

Primary Examiner—Charles Bowers
Assistant Examiner—Nema Berezny
(74) Attorney, Agent, or Firm—Marger Johnson & McCollo, P.C.

(57) ABSTRACT

A method for forming a metal interconnection filing a contact hole or a groove having a high aspect ratio. An interdielectric layer pattern having a recessed region corresponding to the contact hole or the groove is formed on a semiconductor substrate, and a barrier metal layer is formed on the entire surface of the resultant structure where the interdielectric layer pattern is formed. An anti-nucleation layer is selectively formed only on the non-recessed region of the barrier metal layer, thereby exposing the barrier metal layer formed on the sidewalls and the bottom of the recessed region. Subsequently, a metal plug is selectively formed in the recessed region, surrounded by the barrier metal layer, thereby forming a metal interconnection for completely filling the contact hole or the groove having a high aspect ratio. A metal liner may be formed instead of the metal plug, followed by forming a metal layer filling the region surrounded by the metal liner, thereby forming metal interconnection for completely filling the contact hole or groove having a high aspect ratio.

66 Claims, 4 Drawing Sheets

METHOD FOR FORMING METAL INTERCONNECTION IN SEMICONDUCTOR DEVICE

BACKGROUND OF THE INVENTION

1. Field of the Invention

The present invention relates to a manufacturing method of an integrated semiconductor circuit, and more particularly, to a method for forming a metal interconnection in a semiconductor device.

2. Description of the Related Art

In general, a semiconductor device includes transistors, resistors and capacitors. A metal interconnection is required for realizing the semiconductor device on a semiconductor substrate. The metal interconnection which transmits electric signals must have low electric resistance, and be economical and reliable. Aluminum has been widely used as a metal interconnection.

As semiconductor devices become more highly integrated, the width or thickness of the metal interconnection must be reduced, requiring the size of a contact hole be reduced. Therefore, the aspect ratio of the contact hole increases, requiring new methods for completely filling the contact hole with the metal interconnection. One proposed method for completely filling a contact hole that has a high aspect ratio and a metal interconnection is the selective chemical vapor deposition (CVD) process. The selective CVD process uses the characteristic in which a growth rate of the metal layer on an insulating layer is different from that on a conductive layer. However, as the integration density of the semiconductor device increases, the junction depth of a source/drain region of a transistor is reduced. Accordingly, an aluminum layer used as the metal interconnection is penetrated to the shallow source/drain region to be diffused to a semiconductor substrate, thereby causing a junction spiking phenomenon. Therefore, a method for interposing a barrier metal layer between the aluminum layer and the source/drain region has been used to suppress the reaction of aluminum atoms of the aluminum layer with silicon atoms of the source/drain region. The barrier metal layer is formed on the entire surface of the resultant structure where the contact hole is formed Therefore, it is impossible to selectively form the metal interconnection only in the contact hole by selective CVD process since a blanket barrier metal layer is present.

SUMMARY OF THE INVENTION

To solve the above problems, it is an objective of the present invention to provide a method for forming a metal interconnection capable of selectively forming a metal layer for interconnection in a contact hole or a groove.

According to one embodiment of the present invention for achieving the above objective, an interdielectric layer is formed on a semiconductor substrate. Then, a predetermined region of the interdielectric layer is etched, to form an interdielectric layer pattern having a recessed region. Here, the recessed region may be a contact hole for exposing the predetermined region of the semiconductor substrate or a groove which is shallower than the thickness of the interdielectric layer. When the recessed region is a groove, the metal interconnection is formed through a damascene process.

Subsequently, a barrier metal layer, i.e. a titanium nitride (TiN) layer, is formed on the entire surface of the resultant structure where the interdielectric layer pattern is formed.

Here, when the recessed region is the contact hole for exposing the predetermined region of the semiconductor substrate, i.e. a source/drain region of a transistor, an ohmic metal layer must be formed on the entire surface of the resultant structure where the interdielectric layer pattern is formed, before forming the barrier metal layer. Then, the barrier metal layer is annealed at a predetermined temperature if necessary, to fill the grain boundary region of the barrier metal layer with oxygen atoms. This is for preventing the diffusion of silicon atoms of the semiconductor substrate through the barrier metal layer.

Subsequently, an anti-nucleation layer, e.g. an insulating layer, is selectively formed only on the barrier metal layer formed on the non-recessed region, to thereby expose only the barrier metal layer formed on the sidewalls and the bottom of the recessed region. The insulating layer is for selectively forming a metal interconnection only in the recessed region in a process to be performed later. That is, using a characteristic in which the metal layer is not deposited on the insulating layer, the metal layer used for the metal interconnection is formed by the CVD process. Preferably, the insulating layer is one selected from the group consisting of a metal oxide layer, a metal nitride layer, a SiC layer, a BN layer, a SiN layer, a TaSiO layer and a TiSiO layer.

The metal oxide layer can be formed by selectively forming a layer having excellent oxidation characteristics, i.e. a metal layer, only on the barrier metal layer formed on the non-recessed region, and then exposing the metal layer to air or to $O_2$ plasma. Also, the metal oxide layer can be formed by loading and oxidizing the resultant structure in a furnace, where the metal layer has excellent oxidation characteristics. The metal nitride layer, e.g. an aluminum nitride layer, may be formed by selectively forming an aluminum layer only on the barrier metal layer formed on the non-recessed region, and then exposing the aluminum layer to $N_2$ or $NH_3$ plasma or performing RTP in an atmosphere of $NH_3$ and/or $N_2$.

Preferably, a metal layer for forming the metal oxide layer is formed of an Al layer, a Cu layer, a Au layer, a Ag layer, a W layer, a Mo layer, a Ta layer or a Ti layer. Also, the metal layer may be formed of a metal alloy film containing one selected from the group consisting of Al, Au, Ag, W, Mo and Ta, and at least one selected from the group consisting of Cu, Si, Ge, Ti and Mg.

The metal layer may be formed through sputtering, a chemical vapor deposition (CVD) or a plating process. Preferably, the CVD process is performed at a temperature range corresponding to a mass transported region instead of a surface reaction limited region and at a pressure of 5 Torr or higher so that the metal layer is not formed in the recessed region. It is preferable that an argon gas and a hydrogen gas are used for a carrier gas and a reducing gas, respectively. The hydrogen gas may be used as a carrier gas. Also, the sputtering process for forming the metal layer is performed such that atoms sputtered from the target lose directionality to prevent the anti-nucleation layer from being formed in the recessed region. That is, it is preferable that the sputtering process for forming the anti-nucleation layer is performed at several mTorr using a DC magnetron sputtering apparatus without a collimator to utilize the poor step-coverage.

Alternatively, the anti-nucleation layer may be formed through a reactive sputtering process. The metal oxide layer may be formed through a $O_2$ reactive sputtering process, and the metal nitride layer, i.e. an aluminum nitride layer, may be formed through a $N_2$ reactive sputtering process.

As described above, the anti-nucleation layer for exposing the barrier metal layer formed in the recessed region has characteristics of the insulating layer, so that a metal layer, i.e. an aluminum layer or a copper layer, may be selectively formed in the recessed region. This is because the time required for forming metal nuclei on the anti-nucleation layer being an insulating layer is several tens through several hundreds times longer than the time required for forming metal nuclei on the barrier metal layer being a metal layer. Subsequently, a metal plug for filling a region surrounded by the exposed barrier metal layer, e.g. an aluminum plug, is formed through a selective MOCVD process. The metal plug may be formed of Cu or W instead of Al. Preferably, the aluminum plug is formed through a selective MOCVD process using a precursor containing Al. It is also preferable that the selective MOCVD process for forming the aluminum plug is performed at a temperature corresponding to a surface reaction limited region of aluminum, e.g. at a temperature lower than 300° C. It is preferable that the precursor containing the aluminum is one selected from the group consisting of tri-methyl aluminum, tri-ethyl aluminum, tri-iso butyl aluminum, di-methyl aluminum hydride, di-methyl ethyl amine alane, and tri-tertiary butyl aluminum. Also, the selective MOCVD process uses an argon carrier gas and a hydrogen reducing gas.

Before forming the metal plug, a metal liner may be selectively formed on a surface of the exposed barrier metal layer. Preferably, the metal liner is formed of one selected from the group consisting of Al, Cu, Au, Ag, W, Mo and Ta. Also, the metal liner may be formed of a metal alloy film containing one selected from the group consisting of Al, Ag, Au, W, Mo and Ta, and at least one selected from the group consisting of Cu, Si, Ge, Ti and Mg. It is preferable that the metal liner, e.g. a Cu liner is formed by a selective CVD process, e.g. a selective MOCVD process. The selective MOCVD process for forming the Cu liner is performed using a metal source containing Cu, e.g. $Cu^{+1}$(hfac)TMVS. When the Cu liner is formed, the metal plug and Cu liner are mixed during an annealing process to thereby form a metal interconnection containing copper. Accordingly, the reliability of the metal interconnection, i.e. an electromigration characteristic thereof is improved.

When the metal plug, i.e. the aluminum plug overgrows, a sharp protrusion may be formed on a surface of the metal plug. This is because the aluminum layer has a face centered cubic (FCC) structure. Accordingly, when the metal plug overgrows, it is preferable that the metal plug is planarized through a sputter etch process or a chemical mechanical polishing (CMP) process. The above-described process is a process for forming a damascene interconnection. If necessary, the metal interconnection may be formed by additionally forming a metal layer for covering the planarized metal plug, i.e. an aluminum layer, a tungsten layer, a copper layer or an aluminum alloy layer.

According to another (second) embodiment of the present invention for accomplishing the above object, an interdielectric layer pattern having a recessed region, a barrier metal layer pattern and an anti-nucleation layer are formed in the same manner as the first embodiment, to thereby expose the barrier metal layer formed on the sidewalls and bottom of the recessed region. Also, like the first embodiment, an ohmic metal layer may be formed on the entire surface of the resultant structure where the interdielectric layer pattern is formed, before forming the barrier metal layer, and the barrier metal layer may be annealed after forming the barrier metal layer. Then, the metal liner is selectively formed on a surface of the exposed barrier metal layer. Here, the metal liner may be a single metal liner or a double metal liner obtained by sequentially forming first and second metal liners. It is preferable that the single metal liner is a metal layer formed of one selected from the group consisting of Cu, Al, Ag, Au, W, Mo and Ta. Also, the single metal liner may be a metal alloy layer containing one selected from the group consisting of Al, Au, Ag, W, Mo and Ta, and at least one selected from the group consisting of Cu, Si, Ge, Ti and Mg. It is preferable that the first and second metal liners of the double metal liner are a copper liner and an aluminum liner, respectively. The copper liner is formed through a selective MOCVD process using a precursor containing Cu, e.g. Cu+1(hfac)TMVS, as a metal source and the aluminum liner is formed through a selective MOCVD using a precursor containing Al as a metal source. Here, the copper liner and the aluminum liner are formed at temperature ranges corresponding to surface reaction limited regions of Cu and Al, respectively. Preferably, the precursor containing Al is one selected from the group consisting of tri-methyl aluminum, tri-ethyl aluminum, tri-iso butyl aluminum, di-methyl aluminum hydride, di-methyl ethyl amine alane, and tri-tertiary butyl aluminum.

Subsequently, a metal layer, e.g. an aluminum layer, a W layer, a Cu layer or an Al alloy layer, is formed on the resultant structure where the metal liner is formed, through a combination of CVD and sputtering process. Then, the metal layer is reflowed at 350–500° C. to form a planarized metal layer for completely filling the region surrounded by the metal liner. At this time, the planarized metal layer is changed to a metal alloy layer in which the metal liner, e.g. the Cu liner and the metal layer are mixed during the reflow process. Accordingly, the reliability of the metal interconnection, i.e. an electromigration characteristic, may be improved.

According to the present invention, the anti-nucleation layer is selectively formed only on the barrier metal layer formed on the non-recessed region, thereby selectively forming the metal plug or the metal liner in the recessed region and further form the metal interconnection for completely filling a contact hole and a groove having a high aspect ratio.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Figure 1:
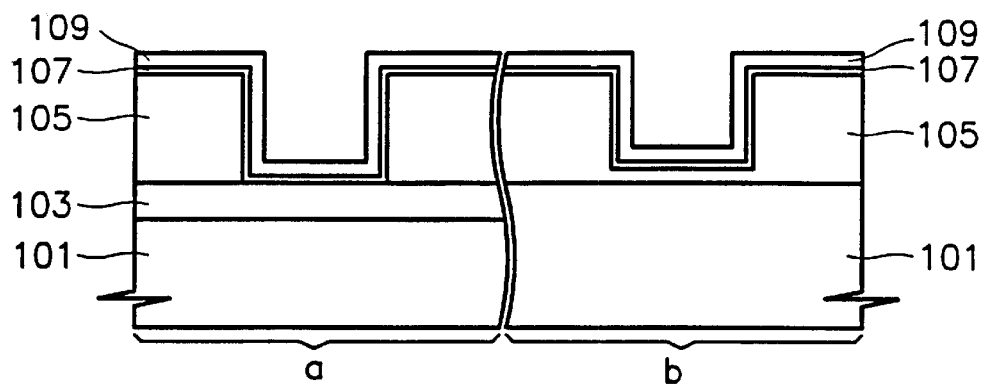
FIGS. 1 through 5 are sectional views for illustrating a method for forming a metal interconnection according to one embodiment of the present invention.

In FIGS. 1 through 5, reference character 'a' indicates a contact hole region, and reference character 'b' indicates a groove region where a damascene metal interconnection is formed. In the drawings, the thickness of layers and regions are not to scale and are exaggerated for clarity.

FIG. 1 is a sectional view for illustrating a step of forming an interdielectric layer pattern 105 having a recessed region and a barrier metal layer 109. Here, the recessed region may be a contact hole for exposing a predetermined region of a semiconductor substrate, i.e. an impurity layer, or a groove having a depth which is less than the thickness of the interdielectric layer.

In the step of forming the contact hole, an impurity layer 103 doped with an N-type or P-type impurity is formed on a surface of contact hole region 'a' of the semiconductor substrate 101, and an interdielectric layer, i.e. a borophosphosilicate glass layer or an undoped silicon oxide layer, is formed on the entire surface of the resultant structure where the impurity layer 103 is formed. Subsequently, the interdielectric layer on the contact hole region 'a' is etched to form a contact hole for exposing the impurity layer 103.

Meanwhile, a groove for forming the damascene interconnection is created by etching the interdielectric layer on the groove region 'b' to a predetermined depth. The depth of the groove is less than the thickness of the interdielectric layer. By forming the contact hole or the groove, an interdielectric layer pattern 105 having a recessed region on its surface is formed.

Next, an ohmic metal layer 107 and a barrier metal layer 109 are sequentially formed on the entire surface of the resultant structure where the recessed region is formed. It is preferable that the ohmic metal layer 107 and the barrier metal layer 109 are formed of a titanium layer and a titanium nitride layer, respectively.

Subsequently, the barrier metal layer 109 is treated at a predetermined temperature to fill a grain boundary region of the barrier metal layer with oxygen atoms, which is known as a stuffing process. Metal atoms of the ohmic metal layer 107 react with silicon atoms of the impurity layer 103 to form a metal silicide layer. When the barrier metal layer 109 is annealed, then the contact resistance is improved due to a metal silicide layer formed between the impurity layer 103 and the barrier metal layer 109. A diffusion phenomenon of silicon atoms in the impurity layer 103 and aluminum atoms diffusing in the metal layer to be formed in a subsequent process may be suppressed by the stuffed barrier metal layer 109. Accordingly, in the case of forming only the damascene interconnection, the process of forming the ohmic metal layer 107 and a process of annealing the barrier metal layer 109 can be omitted. The process of annealing the barrier metal layer 109 is performed at 400~550° C. in a $N_2$ atmosphere for 30–60 minutes, or at 650~850° C. in a $NH_3$ atmosphere through rapid thermal processing (RTP). The RTP is preferably performed for 30–120 seconds.

Figure 2:
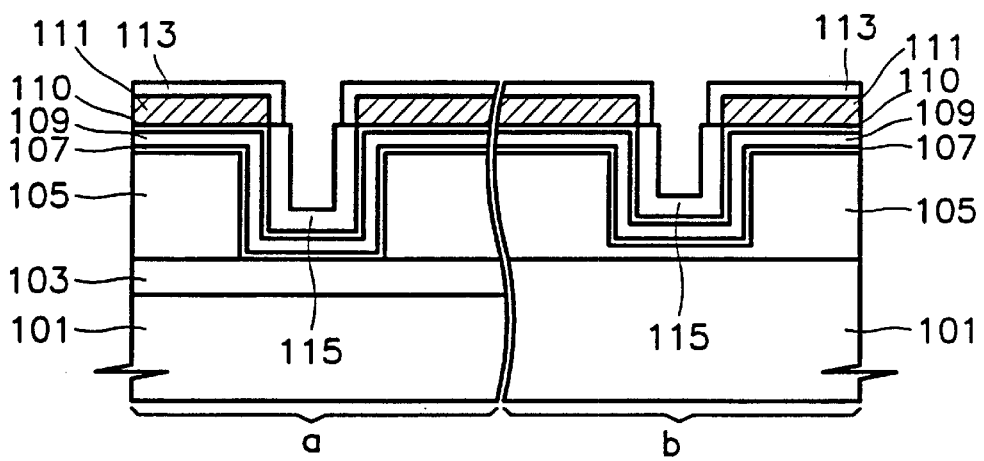

FIG. 2 is a sectional view for illustrating a step of forming a copper layer 110, an anti-nucleation layer 113 and a metal liner 115. In detail, the copper layer 110 is formed on the entire surface of the annealed barrier metal layer 109 to a thickness of 10~300 A.

Subsequently, a material layer 111 of 20~300 A obtained through a physical vapor deposition process (a sputtering process), i.e. an aluminum layer, a titanium layer or a tantalum layer, is formed on the resultant structure where the copper layer 110 is formed. It is preferable that the material layer 111 is formed using a DC magnetron sputtering apparatus without collimator. Also, it is preferable that the DC magnetron sputtering process is performed at 10~30° C. and at a pressure of 3~10 mTorr.

When the material layer 111 is formed using the DC magnetron sputtering apparatus having no collimator at 3~10 mTorr, or more preferably 5~10 mTorr, the directionality of the sputtered metal atoms is lost to thereby prevent formation of the material layer 111 in the recessed region. Accordingly, as shown in FIG. 2, the material layer 111, is selectively formed only on the interdielectric layer pattern 105, leaving the copper layer 110 formed in the recessed region exposed. The semiconductor substrate is cooled to a temperature corresponding to that of a surface reaction limited region, i.e. 10~30° C. (in the aluminum layer) or preferably, 25° C. to thereby form an aluminum layer.

When the metal layer is formed at a low temperature, the metal layer having a uniform thickness may be obtained even when an ultra thin film of 20 A or less is formed. Alternatively, the material layer 111 may be formed through a chemical vapor deposition process. It is preferable that the material layer 111 is formed of a metal layer having excellent oxidation characteristics, e.g. an aluminum (Al) layer, a titanium (Ti) layer, or a tantalum (Ta) layer. It is preferable to use a chemical vapor deposition process for forming the material layer 111 at a temperature corresponding to that of a mass transported region instead of the surface reaction limited region and a pressure of 5 Torr or higher, to prevent formation of the material layer 111 in the recessed region.

For example, in the case that the material layer 111 is formed of the aluminum layer through the chemical vapor deposition process, when the aluminum layer is formed at a temperature range corresponding to that of the mass transported region of aluminum, i.e. approximately 180° C. or higher, the aluminum layer may be prevented from being formed in the recessed region. It is preferable that argon and hydrogen are used for a carrier gas and a reducing gas, respectively.

As the aspect ratio of the recessed region increases, the effectiveness of selectively forming the material layer 111 only on the interdielectric layer pattern 105 increases. Accordingly, as increased integration of semiconductor devices requires a recessed region to have a high aspect ratio, the material layer 111 may be more selectively formed. Preferably, the aluminum layer used as the material layer 111 is formed to a thickness of 25~100 A. The process of forming the copper layer 110 may be omitted as circumstances may require.

At this stage, the material layer 111 is selectively formed only on the barrier metal layer 109 on the interdielectric layer pattern 105. The barrier metal layer 109 formed in the recessed region is exposed. Then, the resultant structure where the material layer 111 is formed is exposed to air or oxygen plasma, oxidizing the material layer 111, and thereby forming an anti-nucleation layer 113, i.e. an aluminum oxide ($Al_2O_3$) layer, a titanium oxide ($TiO_2$) layer or a tantalum oxide ($Ta_2O_5$) layer.

When the material is oxidized by exposure to air, as shown in FIG. 2, the material layer 111 may be partially changed to the anti-nucleation layer 113. Also, when the material layer 111 is formed of an aluminum layer, then the anti-nucleation layer 113 may be formed of an aluminum nitride layer (AlN).

The aluminum nitride layer may be formed by exposing the resultant structure, where the aluminum layer is selectively formed only on the non-recessed region of the interdielectric layer pattern 105, to $N_2$ plasma or by applying Rapid Thermal Processing (RTP) on the resultant structure in an atmosphere of NH3. It is preferable that the RTP for forming the aluminum nitride layer is performed at 500~850° C. for 30~180 seconds. When the aluminum layer is nitrided to form the anti-nucleation layer 113, the effect of annealing the barrier metal layer 109 exposed to the recessed region is obtained to thereby strengthen the characteristics of the barrier metal layer 109.

Meanwhile, the anti-nucleation layer 113, i.e. an aluminum oxide layer, an aluminum nitride layer, a titanium oxide layer or a tantalum oxide layer, may be formed through an $O_2$ reactive sputtering process or $N_2$ reactive sputtering process. In detail, the anti-nucleation layer 113 of 20~200 A is formed on the resultant structure where the barrier metal layer 109 is formed or where the barrier metal layer 109 and the copper layer 110 are formed through a reactive sputtering process using radio frequency power (RF power).

It is preferable that the anti-nucleation layer 113 be formed to a thickness of 100~200 A when the damascene interconnection is formed. The reason for this is that when a chemical mechanical deposition (CMP) process for planarizing the metal layer is performed in forming the damascene interconnection, the anti-nucleation layer 113 functions as a polishing stopper.

It is preferable that the reactive sputtering process is performed at a pressure of 2~8 mTorr. Here, if argon gas and oxygen gas are used for the reaction gas and aluminum is used for a metal target when performing the reactive sputtering process, then the aluminum oxide layer is formed. Similarly, when argon gas and oxygen gas are used for the reaction gas and a titanium target or a tantalum target is used for a metal target, then the titanium oxide layer or the tantalum oxide layer is formed. Also, when argon gas and nitrogen gas are used for the reaction gas and aluminum is used for the metal target, then the aluminum nitride layer is formed.

Meanwhile, the anti-nucleation layer 113 may be formed of a SiC layer. The SiC layer is formed through the reactive sputtering process using RF power. The argon gas and CH4 gas are used for the reaction gas and silicon is used for the target.

Also, a metal liner 115, i.e. a copper liner, is selectively formed only on a surface of the exposed copper layer 110 or the exposed barrier metal layer 109 to a thickness less than 10 A. Here, when the copper layer 110 is formed, the metal liner 115, i.e. the copper liner, is not required. Also, according to circumstances, both the copper layer 110 and the metal liner 115 may be omitted. The copper liner 115 is formed through a selective MOCVD process using $Cu^{+1}$ (hfac)TMVS as a metal source. It is preferable that the selective MOCVD process for forming the copper liner 115 is performed at 100 mTorr~10 Torr and 150~350° C. The copper layer 110 or the copper liner is formed for improving the reliability of the interconnection including a metal plug to be formed, i.e. an electromigration characteristic of the metal interconnection.

Figure 3:
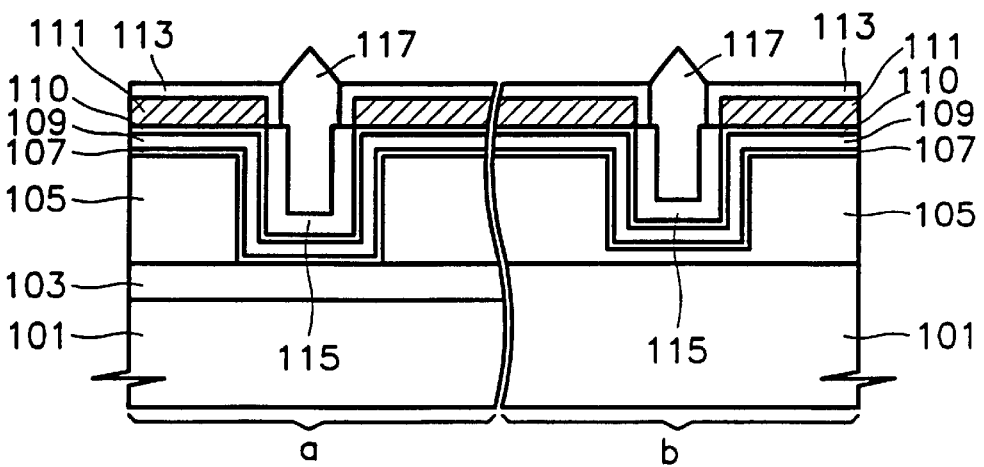

FIG. 3 is a sectional view for illustrating a step of forming a metal plug 117. In detail, the metal plug 117 for filling a region surrounded with the metal liner 115, i.e. an aluminum plug, is formed through a selective MOCVD process. The selective MOCVD process for forming the aluminum plug is performed using a dimethyl-ethyl-amine-alane (DMEAA) as the metal source, at a deposition temperature of 100~200° C., preferably 120° C., and 0.5~5 Torr, preferably 1 Torr. A bubbler is used for supplying the DMEAA, the metal source, into a process chamber of the MOCVD apparatus which is maintained at room temperature.

In the MOCVD process for selectively forming the aluminum plug, argon gas is used as a gas for transmitting a metal source, i.e. a carrier gas, and hydrogen gas is used as a gas for reducing the metal source. Since a metal nucleation time on the surface of the insulating layer, i.e. the anti-nucleation layer 113, is tens to hundreds times longer than that on a surface of the exposed metal liner 115, the copper layer 110 or the barrier metal layer 109, the metal plug 117 is selectively formed only in the recessed region. It is preferable to control the thickness of growth of the metal plug 117 to a thickness corresponding to 100~110% of the radius of a hole formed by the metal liner 115 in order to form the metal plug for completely filling a region surrounded by the metal liner 115.

However, when the metal plug 117 is formed based on the wide part of the recessed region, then the metal plug 117 grows to excess and forms a protrusion on the surface due to the narrowness of the lower part of the recessed region. In particular, when the metal plug 117 is formed of an aluminum layer, as shown in FIG. 3, the protrusion may be formed sharply. This is due to the aluminum layer being formed in a face centered cubic (FCC) structure. The metal plug 117, which is formed of an aluminum layer in the preferred embodiment, may be formed of copper, silver or gold. Also, when a process of forming the copper layer 110 or the copper liner 115 is omitted, it is preferable that the metal plug 117 is formed of aluminum alloy containing copper, e.g. a Al—Si—Cu layer or a Al—Cu layer.

Figure 4:
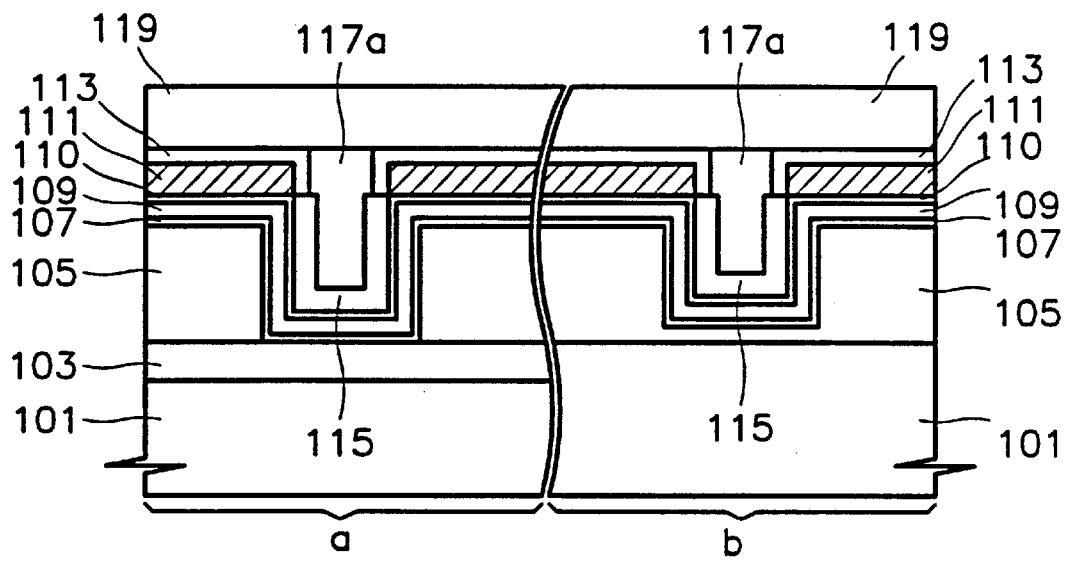

FIG. 4 is a sectional view for illustrating a step of forming a planarized metal plug 117a and an interconnection metal layer 119. In detail, when a protrusion is formed on a surface of the excessively grown metal plug 117, the protrusion of the metal plug 117 is removed to form a planarized metal plug 117a.

For this step, a sputter etch process or a chemical mechanical polishing process may be used. Also, the metal plug 117 may be planarized by reflowing the metal plug 117, i.e. an aluminum plug, at 350~500° C., preferably 450° C., for 30~180 seconds, preferably 60 seconds.

When the metal plug 117 is formed of other metal layers instead of the aluminum layer, then the metal plug is preferably reflowed at a temperature of 0.6×Tm or higher. Here, Tm denotes the melting temperature of the metal layer for forming metal plug 117. A native oxide layer must not exist on the surface of the metal plug 117 in order to perform the reflow process.

Accordingly, in the case of forming the metal plug 117 using a cluster apparatus including an MOCVD chamber and a sputter chamber, it is preferable that the metal plug 117 is planarized through a reflow process. This is because the resultant structure where the metal plug 117 is formed can be transmitted to a sputter chamber in a vacuum.

When a copper liner or a copper layer 110 is formed under the metal plug 117, i.e. the aluminum plug is planarized through the reflow process, then the planarized metal plug 117a, i.e. the planarized aluminum plug, includes copper by reaction with a copper liner 115 or the copper layer 110. Accordingly, the reliability of the damascene interconnection composed of the barrier metal layer 109 and the planarized metal plug 117a may be increased. If the metal plug 117 did not grow too large, then the step of forming the planarized metal plug 117a may be omitted. A metal layer 119, i.e. an aluminum layer, an aluminum alloy layer or a copper layer, is formed on the entire surface of the resultant structure where the planarized metal plug 117a is formed, at 200° C. or lower. This is for obtaining a smooth surface morphology and a dense film quality.

Figure 5:
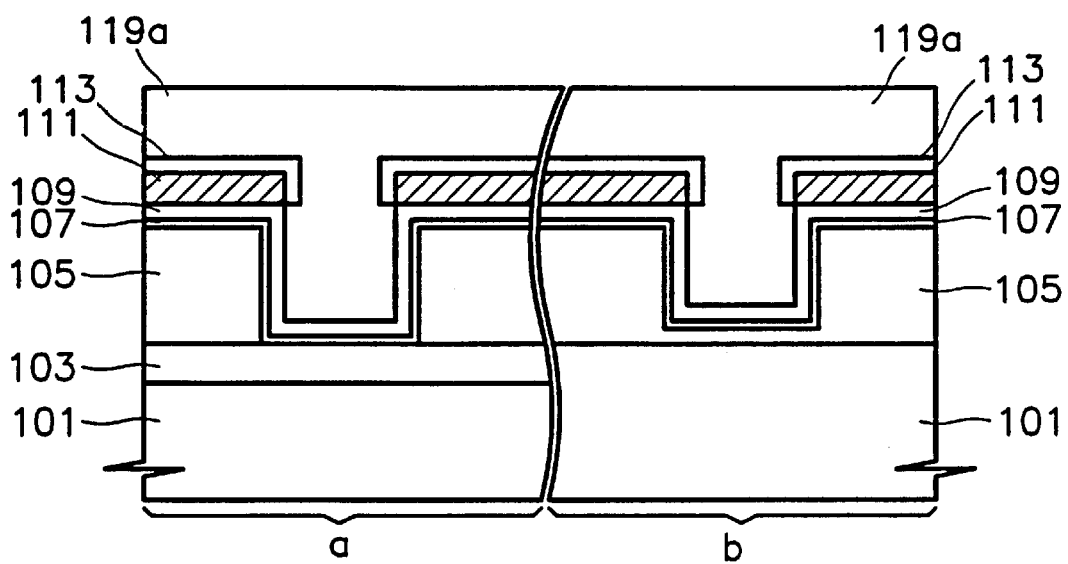

FIG. 5 is a sectional view for illustrating a step of forming a metal alloy layer 119a. The step of forming the metal alloy layer 119a is useful for the case of planarizing the metal plug 117 through the sputter etch process or the CMP process or in the case of omitting the step of planarizing the metal plug 117. In detail, the sputter etch process or the CMP process is performed at 300° C. or lower. Accordingly, the metal plug 117 does not react with the copper layer 110 or the copper liner 115. When a metal layer 119, i.e. an aluminum layer, is formed on the entire surface of the resultant structure where the metal plug 117 or the planarized metal plug 117a is formed, at 200° C. or lower, and then the aluminum layer is annealed at 350~500° C., the metal alloy layer 119a, i.e. an aluminum alloy layer containing copper, may be obtained. At this time, the metal layer 119, i.e. the aluminum layer, may be additionally formed at 350~500° C., instead of annealing the metal layer 119.

In FIGS. 6 through 9, reference characters 'a' and 'b' indicate a contact region and a groove region, respectively, as in FIG. 1.

Figure 6:
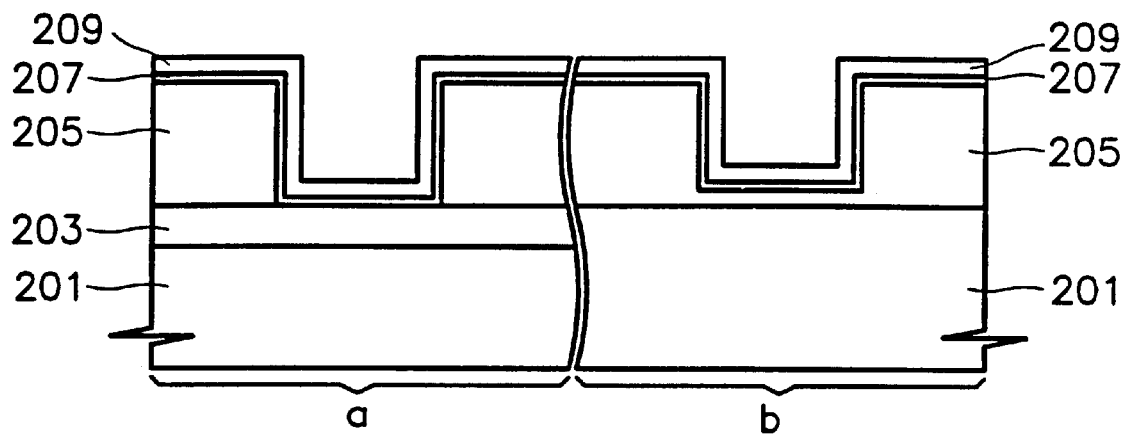
FIGS. 6 through 9 are sectional views for illustrating a method for forming a metal interconnection according to another embodiment of the present invention.

FIG. 6 is a sectional view for illustrating a step of forming an interdielectric layer pattern 205 having a recessed region and a barrier metal layer 209. Here, the recessed region may be a contact hole for exposing an impurity layer 203 or a groove having a depth that is less than the thickness of the interdielectric layer.

The step of forming the interdielectric layer pattern 205 having a recessed region and the barrier metal layer 209 is performed in the same manner as that of the first embodiment. Also, the steps of annealing the impurity layer 203 of the contact hole region 'a', an ohmic metal layer 207 and a barrier metal layer 209 are performed in the same manner as that of the first embodiment. In the case of forming the damascene interconnection, the steps of forming the ohmic metal layer 207 and annealing the barrier metal layer 209 may be omitted, as in the first embodiment.

Figure 7:
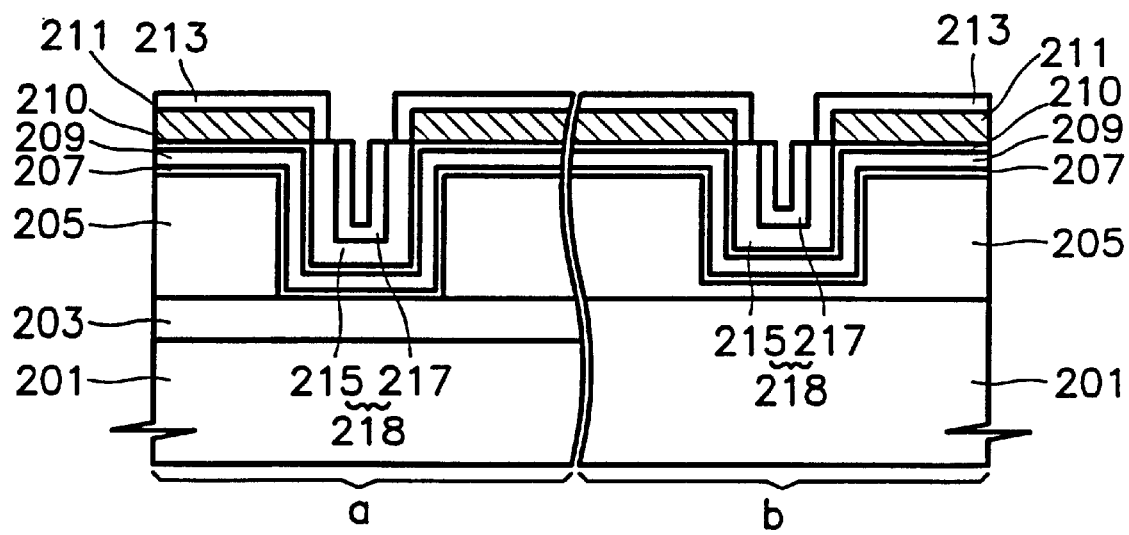

FIG. 7 is a sectional view illustrating a step of forming a copper layer 210, an anti-nucleation layer 213 and a metal liner 218. The copper layer 210 and the anti-nucleation layer 213 are formed in the same manner as the first embodiment described with reference to FIG. 2. In detail, when a material layer 211 selectively formed only on the interdielectric layer pattern 205 is oxidized or nitrided to form the anti-nucleation layer 213, then the selectively formed material layer 211 may partially remain as in the first embodiment.

Meanwhile, the metal liner 218 may be a single metal liner, i.e. a copper liner, as in the first embodiment, or a double metal liner obtained by sequentially forming a first metal liner 215 and a second metal liner 217. Here, it is preferable that the first and second metal liners 215 and 217 are formed of a copper liner and an aluminum liner, respectively. The copper liner is formed through the same process as the method described with reference to FIG. 2, i.e. the selective MOCVD process in which $Cu^{+1}$(hfac)TMVS is used for a metal source. The aluminum liner being the second metal liner 217 is formed through a selective MOCVD process used for forming the metal plug 117 of FIG. 3, i.e. the aluminum plug. However, the thickness of growth of the second metal liner 217 is less than the radius of a hole formed by the first metal liner 215, which is different from the aluminum plug of FIG. 3. Here, the process of forming the copper layer 210 may be omitted if necessary.

Meanwhile, the process temperature for selectively forming the copper liner is determined according to the material of the lower layer, i.e. exposed film material in the recessed region. For example, when the copper liner is selectively formed on a surface of a titanium nitride layer, it is preferable that the deposition temperature of the copper liner is 0~350° C. Preferably, the copper liner is formed at a pressure of 10 Torr and the temperature of the metal source, i.e. $Cu^{+1}$(hfac)TMVS, is maintained at 40~50° C.

Figure 8:
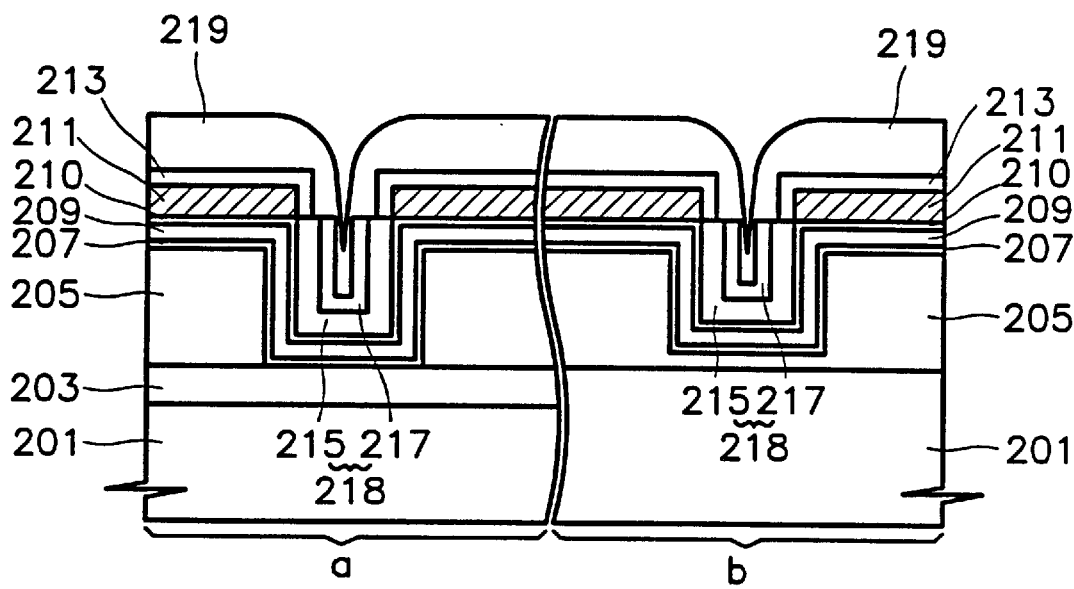

FIG. 8 is a sectional view illustrating a step of forming a metal layer 219. In detail, the metal layer 219, i.e. an aluminum layer or an aluminum alloy layer, is formed on the entire surface of the resultant structure where the metal liner 218 is formed through a combination of CVD and sputtering processes. It is preferred that the aluminum layer or the aluminum alloy layer is formed at a temperature below the reflow temperature. This is to prevent formation voids in the metal layer during planarizing of the metal layer 219 through a reflow process.

Figure 9:
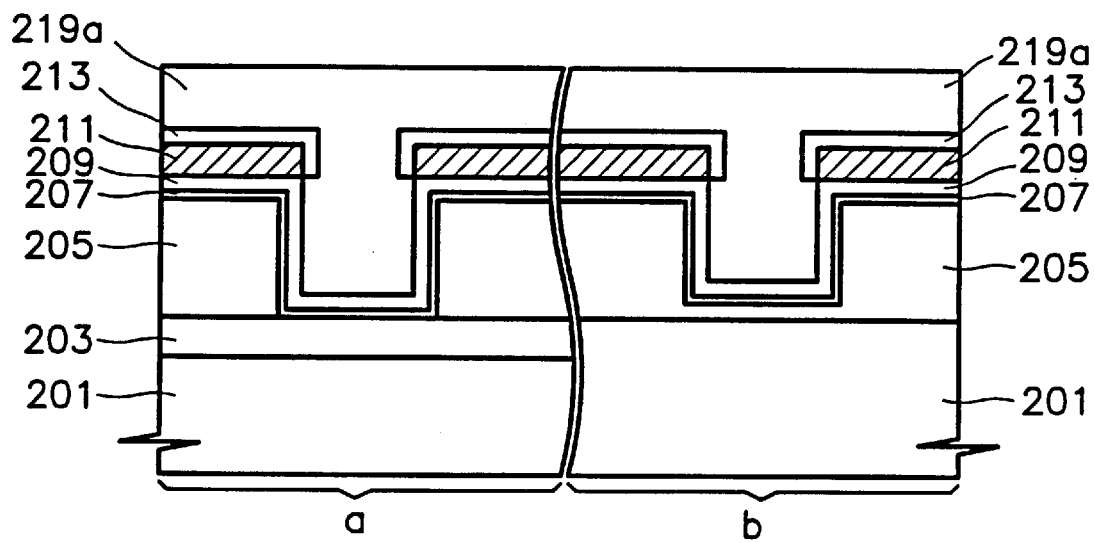

FIG. 9 is a sectional view illustrating a step of forming a planarized metal alloy layer 219a. In detail, the resultant structure where the metal layer 219 is formed is annealed at a predetermined temperature to reflow the metal layer 219. It is preferable that the annealing temperature of the metal layer 219, formed of an aluminum layer or an aluminum alloy layer is 350~500° C. When the metal layer 219 is reflowed by annealing, the metal liner 218 and the metal layer 219 are mixed to form the metal alloy layer 219a having a planarized surface. The planarized metal alloy layer 219a may be formed through a process of additionally forming the metal layer 219 at 350~500° C. instead of the reflow process.

In the described second embodiment of the present invention, the process of forming the metal plug during formation of the metal interconnection, as required for the first embodiment, is not required. Accordingly, the process of planarizing the metal plug may be also omitted.

According to the described embodiments of the present invention, the anti-nucleation layer for exposing a contact hole or groove having a high aspect ratio is selectively formed, which thereby completely fills the contact hole or the groove of a highly-integrated semiconductor device in order to realize a metal interconnection and improve the reliability of the semiconductor device.

The present invention is not limited to the illustrated embodiment and many changes and modifications can be made within the scope of the invention by a person skilled in the art.

What is claimed is:

1. A method for forming a metal interconnection comprising:
   a) forming an interdielectric layer on a semiconductor substrate;
   b) forming an interdielectric layer pattern having a recessed region and a non-recessed region by etching a predetermined region of the interdielectric layer;
   c) forming a barrier metal layer on the resultant structure where the interdielectric layer pattern is formed;
   d) selectively forming a metal oxide layer as an anti-nucleation layer only on the non-recessed region, thereby exposing the barrier metal layer in the recessed region;
   wherein forming a metal oxide layer further comprises selectively forming a metal layer on the non-recessed region by sputtering using a DC magnetron sputtering apparatus without a collimator; and oxidizing the metal layer to form the metal oxide layer;
   e) selectively forming a metal liner on the exposed barrier metal layer within the recessed region; and
   f) after selectively forming the metal liner, selectively forming a metal plug on the metal liner for filling a region surrounded by the exposed barrier metal layer.

2. The method of claim 1, wherein the recessed region is a contact hole for exposing a predetermined region of the semiconductor substrate.

3. The method of claim 1, wherein the recessed region is a groove that is shallower than the thickness of the interdielectric layer.

4. The method of claim 1, wherein before the step of forming the barrier metal layer, an ohmic metal layer is further formed over the interdielectric layer following both the recessed region and the non-recessed region of the interdielectric layer pattern.

5. The method of claim 4, wherein the ohmic metal layer is a titanium layer.

6. The method of claim 1, wherein the barrier metal layer is a titanium nitride layer.

7. The method of claim 1, wherein after the step of forming the barrier metal layer, a copper layer is further formed over the barrier metal layer following both the recessed region and the non-recessed region of the interdielectric layer pattern.

8. The method of claim 1, wherein after the step of forming the barrier metal layer, the barrier metal layer is further annealed.

9. The method of claim 1, wherein the metal layer is one selected from the group consisting of an aluminum layer, a copper layer, a Ag layer, a Au layer, a tungsten layer, a molibdenum layer, a tantalum layer, and a titanium layer.

10. The method of claim 1, wherein the metal layer is a metal alloy film containing one selected from the group consisting of Al, Ag, Au, W, Mo and Ta, and at least one selected from the group consisting of Cu, Si, Ge, Ti and Mg.

11. The method of claim 1, wherein the metal oxide layer is formed by exposing the metal layer to air.

12. The method of claim 1, wherein the metal oxide layer is formed by exposing the metal layer to an oxygen plasma.

13. The method of claim 1, wherein the metal liner is one selected from the group consisting of an aluminum liner, a copper liner, an Ag liner, an Au liner, a tungsten liner, a Mo liner and a tantalum liner.

14. The method of claim 1, wherein the metal liner is a metal alloy film containing one selected from the group consisting of Al, Ag, Au, W, Mo and Ta, and at least one selected from the group consisting of Cu, Si, Ge, Ti and Mg.

15. The method of claim 13, wherein the Cu liner is formed through a selective MOCVD process.

16. The method of claim 15, wherein the selective MOCVD process is performed using a metal source containing Cu.

17. The method of claim 16, wherein the metal source containing Cu is $Cu^{+1}$(hfac)TMVS.

18. The method of claim 1, wherein the metal plug is one selected from the group consisting of an aluminum plug, a copper plug, and a tungsten plug.

19. The method of claim 18, wherein the aluminum plug is formed through a selective metal organic CVD (MOCVD) process.

20. The method of claim 19, wherein the selective MOCVD process is performed at a temperature corresponding to a surface reaction limited region of aluminum using a precursor containing aluminum.

21. The method of claim 20, wherein the precursor containing aluminum is one selected from the group consisting of tri-methyl aluminum, tri-ethyl aluminum, tri-iso butyl aluminum, di-methyl aluminum hydride, di-methyl ethyl amine alane, and tri-tertiary butyl aluminum.

22. The method of claim 20, wherein the selective MOCVD process uses an argon carrier gas and a hydrogen reducing gas.

23. The method of claim 1, further comprising the step of planarizing the metal plug after the step of forming the metal plug.

24. The method of claim 23, wherein the metal plug is planarized by a sputter etch, reflow or chemical mechanical polishing (CMP) process.

25. The method of claim 24, wherein the reflow process is performed at 350 to 500° C. for 30 to 180 seconds.

26. The method of claim 1, further comprising the step of forming a metal layer for covering the metal plug after the step of forming the metal plug.

27. The method of claim 26, wherein the metal layer is one selected from the group consisting of an aluminum layer, a tungsten layer, a copper layer, and an aluminum alloy layer.

28. A method for forming a metal interconnection comprising the steps of:

forming an interdielectric layer on a semiconductor substrate;

forming an interdielectric layer pattern having a recessed region and a non-recessed region, the recessed region formed by etching a predetermined region of the interdielectric layer;

forming a barrier metal layer over the interdielectric layer following both the recessed region and the non-recessed region of the interdielectric layer pattern;

selectively forming an anti-nucleation layer on the barrier metal layer only on the non-recessed region, exposing the barrier metal layer in the recessed region; and forming a metal liner over the exposed barrier metal layer; and forming a planarized metal alloy layer, over where the metal liner was formed, the planarized metal alloy layer reacting with the metal liner.

29. The method of claim 28, wherein the recessed region is a contact hole for exposing a predetermined region of the semiconductor substrate.

30. The method of claim 28, wherein the recessed region is a groove that is shallower than the thickness of the interdielectric layer.

31. The method of claim 28, further comprising the step of forming an ohmic metal layer over the interdielectric layer following both the recessed region and the non-recessed region of the interdielectric layer pattern, before the step of forming the barrier metal layer.

32. The method of claim 31, wherein the ohmic metal layer is a titanium layer.

33. The method of claim 28, wherein the barrier metal layer is a titanium nitride layer.

34. The method of claim 28, further comprising the step of forming a copper layer over the barrier metal layer following both the recessed region and the non-recessed region of the interdielectric layer, after the step of forming the barrier metal layer.

35. The method of claim 28, firer comprising the step of annealing the barrier metal layer, after the step of forming the barrier metal layer.

36. The method of claim 28, wherein the metal layer is one selected from the group consisting of an aluminum layer, a copper layer, an Ag layer, an Au layer, a tungsten layer, a Mo layer, a tantalum layer, and a titanium layer.

37. The method of claim 28, wherein the metal layer is a metal alloy film containing one selected from the group consisting of Al, Ag, Au, W, Mo and Ta, and at least one selected from the group consisting of Cu, Si, Ge, Ti and Mg.

38. The method of claim 28, wherein the metal oxide layer is formed by exposing the metal layer to air.

39. The method of claim 28, wherein the metal oxide layer is formed by exposing the metal layer to an oxygen plasma.

40. The method of claim 28, wherein the metal liner is a single metal liner or a double metal liner obtained by sequentially stacking first and second metal liners.

41. The method of claim 40, wherein the single metal liner is one selected from the group consisting of a copper liner, an aluminum liner, an Ag liner, an Au liner, a tungsten liner, a Mo liner, and tantalum liner.

42. The method of claim 40, wherein the single metal liner is a metal alloy layer containing one selected from the group consisting of Al, Ag, Au, W, Mo and Ta, and at least one selected from the group consisting of Cu, Si, Ge, Ti and Mg.

43. The method of claim 40, wherein the first and second metal liners are a copper liner and an aluminum liner, respectively.

44. The method of claim 41, wherein the copper liner is formed through a selective MOCVD process.

45. The method of claim 43, wherein the copper liner is formed through a selective MOCVD process.

46. The method of claim 75, wherein the selective MOCVD process is performed at a temperature corresponding to a surface limited region of copper using a precursor containing Cu.

47. The method of claim 46, wherein the precursor containing Cu is $Cu^{+1}(hfac)TMVS$.

48. The method of claim 43, wherein the aluminum liner is formed through a selective MOCVD process.

49. The method of claim 48, wherein the selective MOCVD process is performed at a temperature corresponding to a surface limited region of aluminum using a precursor containing Al.

50. The method of claim 49, wherein the precursor containing aluminum is one selected from the group consisting of tri-methyl aluminum, tri-ethyl aluminum, tri-iso butyl aluminum, di-methyl aluminum hydride, di-methyl ethyl amine alane and tri-tertiary butyl aluminum.

51. The method of claim 28, the step of forming the planarized metal alloy layer comprising the substeps of:

forming a metal layer over where the metal liner was formed, through a combination of CVD and sputtering process; and annealing the metal layer at 350~500° C. to mix the metal liner with the metal alloy layer.

52. The method of claim 51, wherein the metal layer is one selected from the group consisting of an aluminum layer, a tungsten layer, a copper layer, and an aluminum alloy layer.

53. A method for forming a metal interconnection comprising:

a) forming an interdielectric layer pattern having a recessed region and a non-recessed region;

b) forming a barrier metal layer over the interdielectric layer pattern;

c) selectively forming a metal layer that covers substantially only the non-recessed region by sputtering using a DC magnetron sputtering apparatus without a collimator, thereby exposing a region of the barrier metal layer in the recessed region;

d) partially oxidizing or nitriding the metal layer; and e) selectively forming a metal plug within t he recessed region.

54. The method of claim 53, which further comprises, after the step of partially oxidizing or nitriding, selectively forming a metal liner on the exposed barrier metal layer, before selectively forming the metal plug within the recessed region.

55. The method of claim 53, which further comprises, before the step b) of forming the barrier metal layer, forming an ohmic metal layer on the interdielectric layer pattern.

56. The method of claim 53, which further comprises, after the step b) of forming the barrier metal layer, forming a copper layer on the barrier metal layer.

57. The method of claim 1, wherein the metal liner is formed of copper.

58. The method of claim 40, wherein the second metal liner is formed to a thickness less than the radius of a hole formed by the first metal liner.

59. A method for forming a metal interconnection comprising:

a) forming an interdielectric layer on a semiconductor substrate;

b) forming an interdielectric layer pattern having a recessed region and a non-recessed region by etching a predetermined region of the interdielectric layer;

c) forming a barrier metal layer on the resultant structure where the interdielectric layer pattern is formed;

d) selectively forming a metal nitride layer as an anti-nucleation layer only on the non-recessed region, thereby exposing the barrier metal layer in the recessed region, wherein forming a metal nitride layer further comprises selectively forming a metal layer on the non-recessed region by sputtering using a DC magnetron sputtering apparatus without a collimator, and nitriding the metal layer;

e) selectively forming a metal liner on the exposed barrier metal layer within the recessed region; and f) after selectively forming the metal liner, selectively forming a metal plug on the metal liner for filling a region surrounded by the exposed barrier metal layer.

60. The method of claim 59, wherein the metal nitride layer is an Aluminum Nitride (AlN) layer.

61. The method of claim 59, wherein the aluminum layer is nitrided by exposure to a nitrogen plasma.

62. The method of claim 59, wherein the aluminum layer is nitrided by performing an RTP process in an atmosphere of $NH_3$ or $N_2$.

63. A method for forming a metal interconnection, comprising:

a) forming an interdielectric layer on a semi conductor substrate;

b) forming an interdielectric layer pattern having a recessed region and a non-recessed region by etching a predetermined region of the interdielectric layer;

c) forming a barrier metal layer on the resultant structure where the interdielectric layer pattern is formed;

d) selectively forming a metal nitride layer as an anti-nucleation layer only on the non-recessed region, thereby exposing the barrier metal layer in the recessed region, wherein forming a metal nitride layer further comprises selectively forming a metal layer on the non-recessed region by sputtering using a DC magnetron sputtering apparatus without a collimator, and nitriding the metal layer;

e) selectively forming a metal liner on the exposed barrier metal layer within the recessed region; and f) forming a planarized metal alloy layer reacted to the metal liner on the surface of the resultant structure where the metal liner is formed.

64. The method of claim 63, wherein the metal nitride layer is an AlN layer.

65. The method of claim 63, wherein the aluminum layer is nitrided by exposure to a nitrogen plasma.

66. The method of claim 63, wherein the aluminum layer is nitrided by performing an RTP process in an atmosphere of $NH_3$ or $N_2$.

* * * * *

UNITED STATES PATENT AND TRADEMARK OFFICE
CERTIFICATE OF CORRECTION

PATENT NO. : 6,376,355 B1
DATED : April 23, 2002
INVENTOR(S) : Yoon et al.

It is certified that error appears in the above-identified patent and that said Letters Patent is hereby corrected as shown below:

Column 1,
Line 43, "formed Therefore," should read -- formed. Therefore, --.

Column 4,
Line 11, "e.g. Cu+1(hfac)TVMS" should read -- e.g. $Cu^{+1}$(hfac)TVMS --.

Column 5,
Line 48, "10~300 A" should read -- 10~300 Å --.
Line 49, "20~300 A" should read -- 20~300 Å --.

Column 6,
Line 5, "20 A or less" should read -- 20 Å or less --.
Line 33, "25~100 A." should read -- 25~100 Å. --.
Line 56, "of NH3. It is" should read -- of $NH_3$. It is --.
Line 67, "of 20~200 A" should read -- of 20~200 Å --.

Column 7,
Line 6, "of 100~200 A when" should read -- of 100~200 Å when --.
Line 27, "gas and CH4" should read -- gas and $CH_4$ --.
Line 33, "10 A. Here," should read -- 10 Å. Here, --.

Column 10,
Line 66, "the step of" should read -- the step C) of --.

Column 11,
Line 1, "over the interdielectric layer following both the recessed region and the non-recessed region of the interdielectric layer pattern." should read -- on the entire surface of the resultant structure where the interdielectric layer pattern is formed. --.
Line 29, "a tungsten liner, a Mo liner and a tantalum liner." should read -- a W liner, a Mo liner and a Ta liner. --.

Column 12,
Line 8, "28. A method for forming a metal interconnection comprising the steps of: forming an interdielectric layer on a semiconductor substrate; forming an interdielectric layer pattern having a recessed region and a non-recessed region, the recessed region formed by etching a predetermined region of the interdielectric layer; forming a barrier metal layer over the interdielectric layer following both the recessed region and the non-recessed region of the interdielectric layer pattern; selectively forming an anti-nucleation layer on the barrier metal layer only on the non-recessed region, exposing the barrier metal layer in the recessed region; and forming a metal liner over the exposed barrier metal layer; and

UNITED STATES PATENT AND TRADEMARK OFFICE
CERTIFICATE OF CORRECTION

PATENT NO. : 6,376,355 B1
DATED : April 23, 2002
INVENTOR(S) : Yoon et al.

It is certified that error appears in the above-identified patent and that said Letters Patent is hereby corrected as shown below:

Column 12 (continued),
forming a planarized metal alloy layer, over where the metal liner was formed, the planarized metal alloy layer reacting with the metal liner." should read
-- 28. A method for forming a metal interconnection comprising:
a) formng an interdielectric layer on a semiconductor substrate;
b) forming an interdielectric layer pattern having a recessed region by etching a predetermined region of the interdielectric layer;
c) forming a barrier metal layer on the entire surface of the resultant structure where the interdielectric layer pattern is formed;
d) selectively forming a metal oxide layer as an anti-nucleation layer on a non-recessed region to expose the barrier metal layer in the recessed region; wherein forming a metal oxide layer further comprises selectively forming a metal layer on the non-recessed region by sputtering using a DC magnetron sputtering apparatus without a collimator; and oxidizing the metal layer to form the metal oxide layer;
(e) selectively forming a metal liner on a surface of the exposed barrier metal layer; and
(f) forming a planarized metal alloy layer reacted to the metal liner on the entire surface of the resultant structure where the metal liner is formed. --.

Column 12,
Line 48, "claim 28, firer comprising" should read -- claim 28, further comprising --.

Column 13,
Line 13, "claim 75, wherein" should read -- claim 45, wherein --.
Line 30, "the planarized metal alloy layer comprising the substeps of:
forming a metal layer over where the metal liner was formed," should read
-- forming the planarized alloy layer comprising the substeps of:
forming a metal layer on the resultant structure where the metal liner is formed, --
Line 54, "within t he recessed" should read -- within the recessed --.

Column 14,
Line 30, "the aluminum layer is nitrided by exposure to a nitrogen plasma." should read -- the metal layer is nitrided by a nitrogen plasma. --.
Line 32, "62. The method of claim 59, wherein the aluminum layer is nitrided by performing an RTP process in an atmosphere of $NH_3$ or $N_2$." should read -- 62. The method of claim 59, wherein the metal layer is nitrided by RTP performed in an atmosphere of $NH_3$ or $N_2$. --.

UNITED STATES PATENT AND TRADEMARK OFFICE
CERTIFICATE OF CORRECTION

PATENT NO. : 6,376,355 B1
DATED : April 23, 2002
INVENTOR(S) : Yoon et al.

It is certified that error appears in the above-identified patent and that said Letters Patent is hereby corrected as shown below:

Column 14 (continued),
Line 61, "65. The method of claim 63, wherein the aluminum layer is nitrided by exposure to a nitrogen plasma." should read -- 65. The method of claim 63, wherein the metal layer is nitrided by exposing the resultant structure where the metal layer is formed to a nitrogen plasma. --.
Line 63, "66. The method of claim 63, wherein the aluminum layer is nitrided by perfroming an RTP process in an atmosphere of $NH_3$ or $N_2$." should read -- "66. The method of claim 63, wherein the metal layer is nitrided by performing RTP in an atmosphere of $NH_3$ or $N_2$. --.

Signed and Sealed this

Seventeenth Day of August, 2004

JON W. DUDAS
*Acting Director of the United States Patent and Trademark Office*